(12) United States Patent
Chen et al.

(10) Patent No.: US 8,717,841 B2
(45) Date of Patent: May 6, 2014

(54) METHOD OF CONTROLLING A REFRESH OPERATION OF PSRAM AND RELATED DEVICE

(75) Inventors: Ho-Yin Chen, Hsinchu County (TW); Shi-Huei Liu, Hsinchu County (TW)

(73) Assignee: Etron Technology, Inc., Hsinchu (TW)

( * ) Notice: Subject to any disclaimer, the term of this patent is extended or adjusted under 35 U.S.C. 154(b) by 116 days.

(21) Appl. No.: 13/553,822

(22) Filed: Jul. 20, 2012

(65) Prior Publication Data

US 2014/0022858 A1    Jan. 23, 2014

(51) Int. Cl.
*G11C 7/00* (2006.01)
(52) U.S. Cl.
USPC .......................... 365/222; 365/233.1; 365/194
(58) Field of Classification Search
CPC .. G11C 11/406; G11C 11/40615; G11C 7/22; G11C 11/4076; G11C 7/1051
USPC .......................... 365/222, 233.1, 194, 189.07
See application file for complete search history.

(56) References Cited

U.S. PATENT DOCUMENTS 7,203,114 B2 * 4/2007 Okuyama ..................... 365/222

\* cited by examiner

*Primary Examiner* — David Lam
(74) *Attorney, Agent, or Firm* — Winston Hsu; Scott Margo

(57) ABSTRACT

A plurality of refresh requests are generated at a predetermined period shorter than the longest time during which a PSRAM is able to retain a data without being refreshed. For two consecutive first and second refresh requests, the second refresh request is ignored if the interval between the first and the second refresh requests is not larger than a predetermined duration. The first refresh request is delayed if the first refresh request conflicts with an external command of the PSRAM.

7 Claims, 2 Drawing Sheets

METHOD OF CONTROLLING A REFRESH OPERATION OF PSRAM AND RELATED DEVICE

BACKGROUND OF THE INVENTION

1. Field of the Invention

The present invention is related to a method of controlling a refresh operation of PSRAM and related device, and more particularly, to a method of providing refresh collision protection in PSRAM and related device.

2. Description of the Prior Art

Random access memory (RAM) is a form of computer data storage. There are two main types of RAM: static RAM (SRAM) and dynamic RAM (DRAM). In DRAM, memory cells are essentially made up of a transistor and capacitor pair. The capacitor holds a high or low charge, and the transistor acts as a switch to allow the control circuitry on the chip to access or change the capacitor's state. Data are stored in the DRAM memory cells in the form of electric charges which need to be periodically refreshed. In SRAM, memory cells store data using flip-flops which do not need to be refreshed, thereby providing faster access time. However, an SRAM device generally is larger in size and consumes more power than a DRAM device.

A pseudo-static RAM (PSRAM) internally uses a cell structure of DRAM and is externally similar to SRAM, thereby combining the higher density of DRAM with the simpler control of SRAM. Refresh operation is also needed to prevent loss of data stored in memory cells. A PSRAM device includes an internal refresh oscillator to perform a refresh operation at a constant period, and may automatically perform a hidden refresh by using a refresh control pulse generated by the refresh oscillator.

If a read/write command is externally input to the PSRAM device while a memory cell is being refreshed by the internal refresh oscillator, data of the memory cell may not be guaranteed to execute the read/write operation. Therefore, a hidden refresh request which conflicts with an external command is delayed and executed later in the prior art PSRAM device. In order to store the delayed hidden refresh commands, the prior art PSRAM device requires many buffers which may occupy large chip area. Also, a delayed hidden refresh request may cause another conflict with a subsequent hidden refresh request, which further complicates the control of the refresh operation in the prior art PSRAM device.

SUMMARY OF THE INVENTION

The present invention provides a method of controlling a refresh operation of a PSRAM. The method includes issuing a plurality of refresh requests periodically; refreshing the PSRAM when a first refresh request is issued; ignoring a second refresh request subsequent to the first refresh request if an interval between the first and the second refresh requests is not larger than a predetermined duration.

The present invention also provides a PSRAM device with refresh collision protection. The PSRAM device includes an internal refresh oscillator configured to issue a plurality of refresh requests periodically; a refresh collision protecting circuit configured to transmit a first refresh request and a second refresh request subsequent to the first refresh request if an interval between the first and the second refresh requests is larger than a predetermined duration, or transmit the first refresh request and ignore the second refresh request if the interval between the first and the second refresh requests is not larger than the predetermined duration; and a PSRAM configured to perform a refresh operation when receiving the first refresh request or the second refresh request from the refresh collision protecting circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
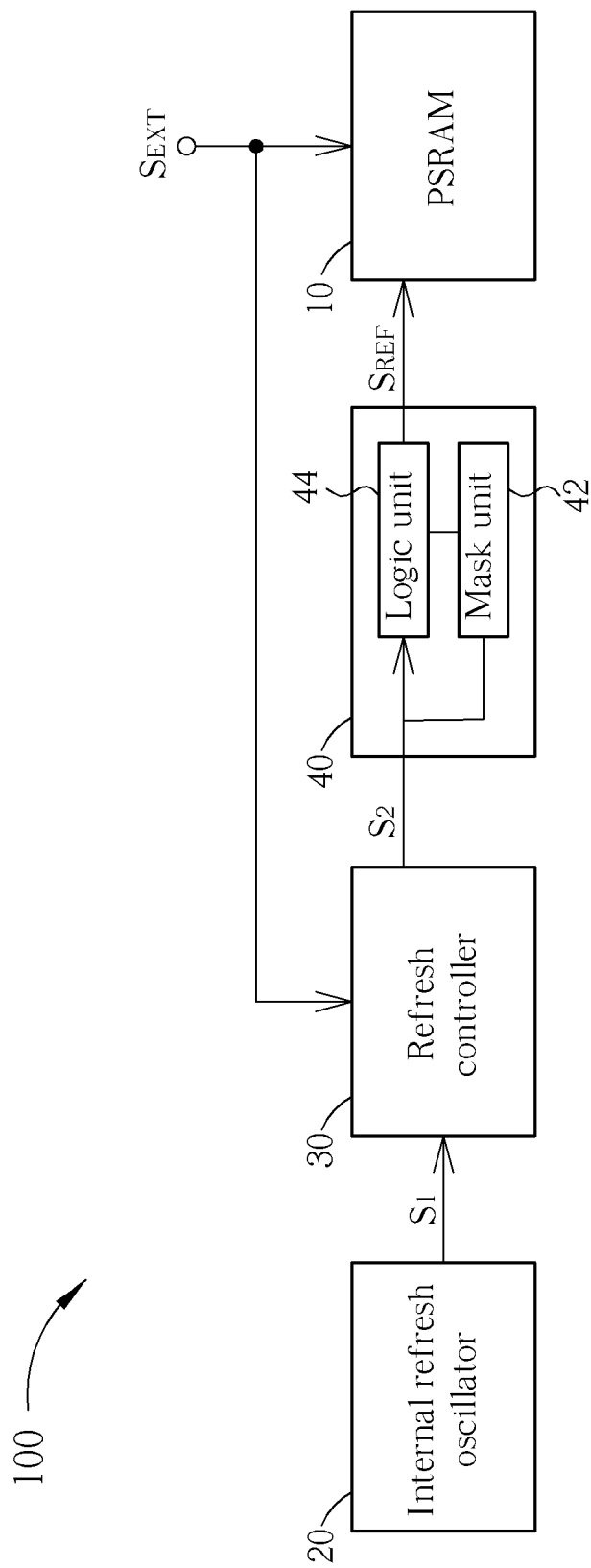
FIG. 1 is a functional diagram illustrating a memory device according to the present invention.

FIG. 1 is a functional diagram illustrating a memory device 100 according to the present invention. The memory device 100 includes a PSRAM 10, an internal refresh oscillator 20, a refresh controller 30, and a refresh collision protecting circuit 40. The PSRAM 10 is configured to operate according to a command signal $S_{EXT}$ or a refresh request signal $S_{REF}$. The internal refresh oscillator 20 is configured to generate a refresh pulse signal S1 with a predetermined period. The refresh controller 30 is configured to generate a pulse signal S2 according to the command signal $S_{EXT}$ and the refresh pulse signal S1. The refresh collision protecting circuit 40, including a mask unit 42 and a logic unit 44, is configured to generate the refresh request signal $S_{REF}$ which provides a protecting duration for a refresh operation of the PSRAM 10.

Figure 2:
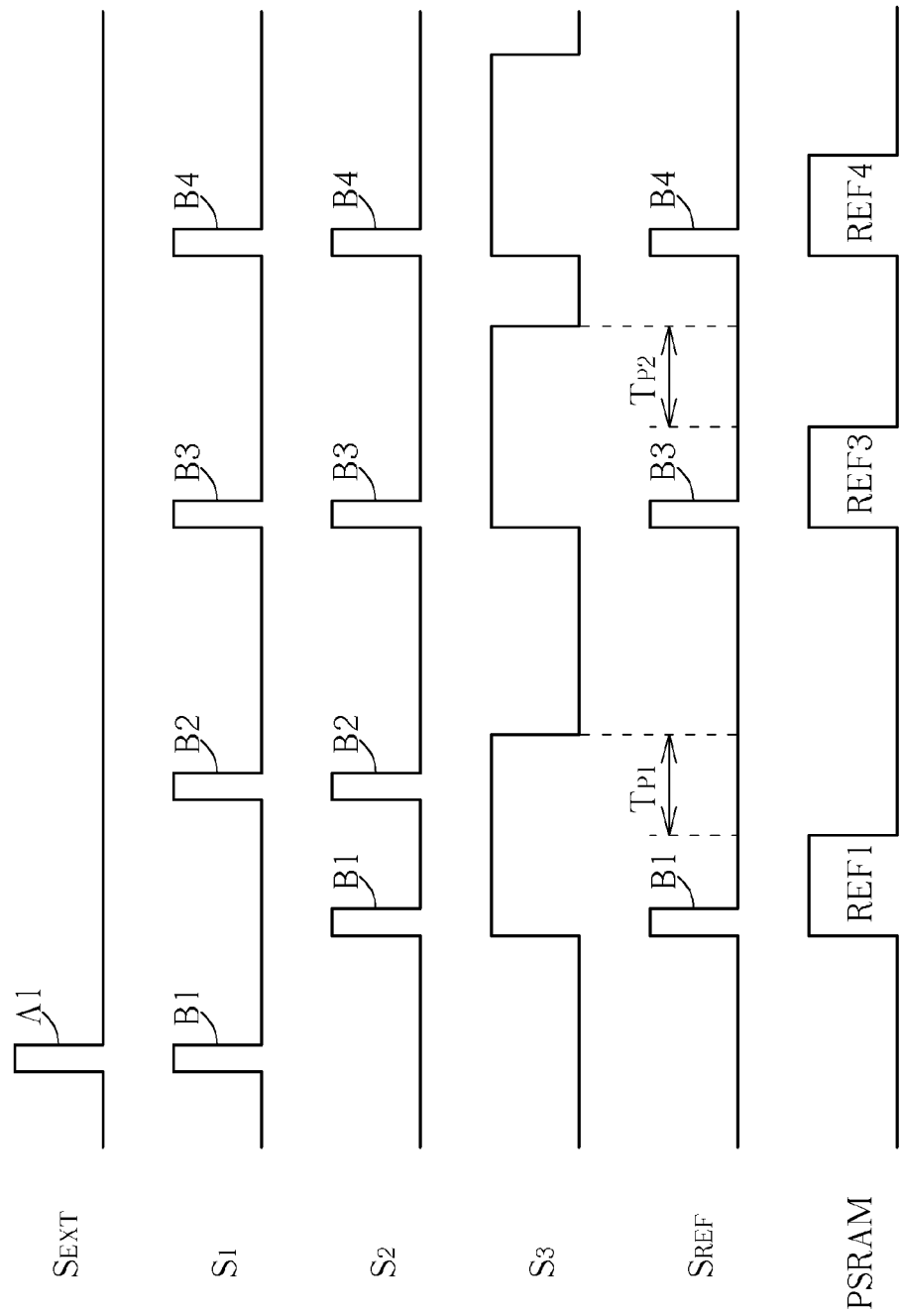
FIG. 2 is a timing diagram illustrating the operation of the memory device according to the present invention.

FIG. 2 is a timing diagram illustrating the operation of the memory device 100 according to the present invention. For illustrative purposes, it is assumed that an external command (depicted as A1) is issued when the command signal $S_{EXT}$ is at high level, hidden refresh requests (depicted as B1-B4) are generated when the refresh pulse signal S1 is at high level, and the PSRAM 10 is requested to perform refresh operations when the refresh request signal $S_{REF}$ is at high level.

As depicted in FIGS. 1 and 2, the refresh controller 30 may compare the refresh request signal $S_{REF}$ with the command signal $S_{EXT}$ and delay a refresh request which conflicts with an external command. For example, since the external command A1 and the hidden refresh request B1 are issued at the same time, the hidden refresh request B1 is delayed in the pulse signal S2.

In the refresh collision protecting circuit 40, the mask unit 42 is configured to generate a mask signal S3 by detecting the pulse signal S2, and the logic unit 44 is configured to generate the refresh request signal $S_{REF}$ according to the pulse signal S2 and the mask signal S3. After executing a refresh request, the mask signal S3 may provide a protecting duration during which all subsequent refresh requests are ignored. For example, since the hidden refresh request B2 are issued before the protecting duration $T_{P1}$ associated with the hidden refresh request B1 expires, the hidden refresh request B2 is dropped and thus absent in the refresh request signal $S_{REF}$. Since the hidden refresh request B3 is issued after the protecting duration $T_{P1}$ associated with the hidden refresh request B1 expires, the hidden refresh request B3 is included in the refresh request signal $S_{REF}$.

Therefore, if a hidden refresh request is delayed when conflicting with an external command, the present refresh collision protecting circuit 40 may provide a protecting duration in order to prevent refresh collision. Since some refresh requests may be ignored to avoid collision, the predetermined period of the pulse signal S1 may be shorter than the longest time the PSRAM 10 is able to retain data without being refreshed. Therefore, the present invention can provide a PSRAM device capable of preventing refresh collisions while retaining data.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of controlling a refresh operation of a pseudo-static random access memory (PSRAM), comprising:
   issuing a plurality of refresh requests periodically;
   refreshing the PSRAM when a first refresh request is issued;
   ignoring a second refresh request subsequent to the first refresh request if an interval between the first and the second refresh requests is not larger than a predetermined duration.

2. The method of claim 1, further comprising:
   refreshing the PSRAM when the second refresh request is issued if the interval between the first and the second refresh requests is larger than the predetermined duration.

3. The method of claim 1, further comprising:
   delaying the first refresh request if the first refresh request conflicts with an external command of the PSRAM.

4. The method of claim 1, further comprising:
   issuing the plurality of refresh requests at a predetermined period shorter than a longest time during which the PSRAM is able to retain a data without being refreshed.

5. A PSRAM device with refresh collision protection, comprising:
   an internal refresh oscillator configured to issue a plurality of refresh requests periodically;
   a refresh collision protecting circuit configured to:
      transmit a first refresh request and a second refresh request subsequent to the first refresh request if an interval between the first and the second refresh requests is larger than a predetermined duration; or
      transmit the first refresh request and ignore the second refresh request if the interval between the first and the second refresh requests is not larger than the predetermined duration; and
   a PSRAM configured to perform a refresh operation when receiving the first refresh request or the second refresh request from the refresh collision protecting circuit.

6. The PSRAM device of claim 5, further comprising:
   a refresh controller configured to delay the first refresh request if the first refresh request conflicts with an external command of the PSRAM device.

7. The PSRAM device of claim 5, wherein the internal refresh oscillator is further configured to issue the plurality of refresh requests at a predetermined period shorter than a longest time during which the PSRAM is able to retain a data without being refreshed.

* * * * *